(12) United States Patent
Goodwin et al.

(10) Patent No.: US 7,508,723 B2
(45) Date of Patent: Mar. 24, 2009

(54) BUFFERED MEMORY DEVICE

(75) Inventors: Paul Goodwin, Austin, TX (US); Brian Miller, Austin, TX (US); Robert Washburn, Austin, TX (US)

(73) Assignee: Entorian Technologies, LP, Austin, TX (US)

( * ) Notice: Subject to any disclaimer, the term of this patent is extended or adjusted under 35 U.S.C. 154(b) by 7 days.

(21) Appl. No.: 11/753,460

(22) Filed: May 24, 2007

(65) Prior Publication Data

US 2008/0291747 A1  Nov. 27, 2008

(51) Int. Cl.
*G11C 7/00* (2006.01)

(52) U.S. Cl. ............... 365/193; 365/233.1; 365/189.05; 365/198; 327/50; 711/105; 711/154; 711/167; 710/113

(58) Field of Classification Search ................ 365/233, 365/233.1, 189.05, 193, 198; 711/105, 154, 711/157; 710/113; 327/50
See application file for complete search history.

(56) References Cited

U.S. PATENT DOCUMENTS

| | | | |
|---|---|---|---|
| 5,272,664 A | 12/1993 | Alexander et al. | |
| 5,283,877 A | 2/1994 | Gastinel et al. | |
| 5,394,541 A | 2/1995 | Chesley et al. | |
| 5,673,419 A | 9/1997 | Nisar | |
| 5,768,624 A | 6/1998 | Ghosh | |
| 6,198,674 B1 * | 3/2001 | Kim ........................... | 365/193 |
| 6,276,844 B1 | 8/2001 | Coteus et al. | |
| 6,487,102 B1 | 11/2002 | Halbert et al. | |
| 6,512,704 B1 * | 1/2003 | Wu et al. ................ | 365/189.07 |
| 6,530,006 B1 | 3/2003 | Dodd et al. | |
| 6,553,450 B1 | 4/2003 | Dodd et al. | |
| 6,587,912 B2 | 7/2003 | Leddige et al. | |
| 6,697,888 B1 | 2/2004 | Halbert et al. | |
| 6,820,163 B1 | 11/2004 | McCall et al. | |
| 6,862,653 B1 | 3/2005 | Dodd et al. | |
| 6,882,082 B2 | 4/2005 | Greeff et al. | |
| 6,882,555 B2 | 4/2005 | Fenstermaker et al. | |
| 7,002,378 B2 * | 2/2006 | Srikanth et al. ............... | 327/50 |
| 7,061,784 B2 | 6/2006 | Jakobs et al. | |
| 2001/0054135 A1 * | 12/2001 | Matsuda ..................... | 711/167 |
| 2002/0001215 A1 * | 1/2002 | Fujisawa et al. ............. | 365/51 |
| 2002/0018396 A1 * | 2/2002 | Morita et al. ............... | 365/233 |
| 2002/0087768 A1 * | 7/2002 | Srikanth et al. ............. | 710/118 |
| 2002/0172079 A1 * | 11/2002 | Hargis et al. ................ | 365/193 |
| 2005/0018494 A1 * | 1/2005 | Wu et al. .................... | 365/193 |
| 2005/0154820 A1 | 7/2005 | Briggs et al. | |
| 2006/0026349 A1 | 2/2006 | Gower et al. | |
| 2006/0092721 A1 * | 5/2006 | Lee ........................... | 365/191 |
| 2006/0179213 A1 | 8/2006 | Brittain et al. | |

OTHER PUBLICATIONS

PC1600/2100 DDR SDRAM Registered DIMM Design Specification, Rev. 1.2, JEDEC Standard No. 21-C, p. 4.20.4-1, Release 11a.

* cited by examiner

*Primary Examiner*—Hoai V Ho
*Assistant Examiner*—Jay Radke
(74) *Attorney, Agent, or Firm*—Fish & Richardson P.C.

(57) ABSTRACT

A memory module having a DRAM device configured to generate a low DQS state on a DQS line, and a buffer coupled to the DRAM device, the buffer having a plurality of drivers, wherein the buffer is configured to detect the low DQS state by comparing the low DQS state to a low voltage level of one of the plurality of drivers.

18 Claims, 7 Drawing Sheets

BUFFERED MEMORY DEVICE

BACKGROUND

The operating speed and computing power of computers and computerized devices has increased dramatically over the past several years. The computers of today are able to operate many times faster than those produced just a few years ago, and this treNd shows no sign of stopping. An important part of these speed increases have been increases in the speed and size of computer memories. Computer memories serve as a short term storage location where a computer's processor can store programs, data, and other information that needs to be accessed relatively quickly. Most computer memories are composed of multiple dynamic random access memory ("DRAM") devices arranged on memory modules, such as dual inline memory modules ("DIMMs"). The memory modules are typically coupled in parallel along a memory channel within the computer. This type of memory arrangement is known as a "multi-drop bus."

As processors have become faster and computer programs have become more complex, the amount of memory in a typical computer and the speed of that memory have increased. Unfortunately, memory operating at these increased speeds becomes more susceptible to signal integrity problems, which also become more prevalent as more and more memory is placed on the multi-drop bus. This leads to one important limitation of conventional multi-drop bus memory systems, the faster the memory devices operate, the less of them that can he used in a computer and vice-versa. The practical effect of this is that computer system designers are sometimes forced to make a tradeoff between memory speed and memory capacity. Customers, however, are demanding both at the same time while also demanding the ability to employ this greater amount of faster memory on existing multi-drop bus systems.

SUMMARY

A memory module having a DRAM device configured to generate a low DQS low state on a DQS line, the DQS low state having a first voltage level unequal to a DQS low state voltage generated by a memory controller associated with the DRAM device, and a buffer coupled to at least one data pin of the DRAM device, the buffer having a plurality of directional drivers coupled to the data pin, wherein the buffer is configured to detect the first voltage level on the low DQS line and to change a driving direction of one or more of the directional drivers in response to detecting the first voltage level state by comparing the low DQS state to a low voltage level of one of the plurality of drivers The details of one or more embodiments of the invention are set forth in the accompanying drawings and the description below.

DESCRIPTION OF DRAWINGS

Like reference symbols in the various drawings indicate like elements.

DETAILED DESCRIPTION

Figure 1:
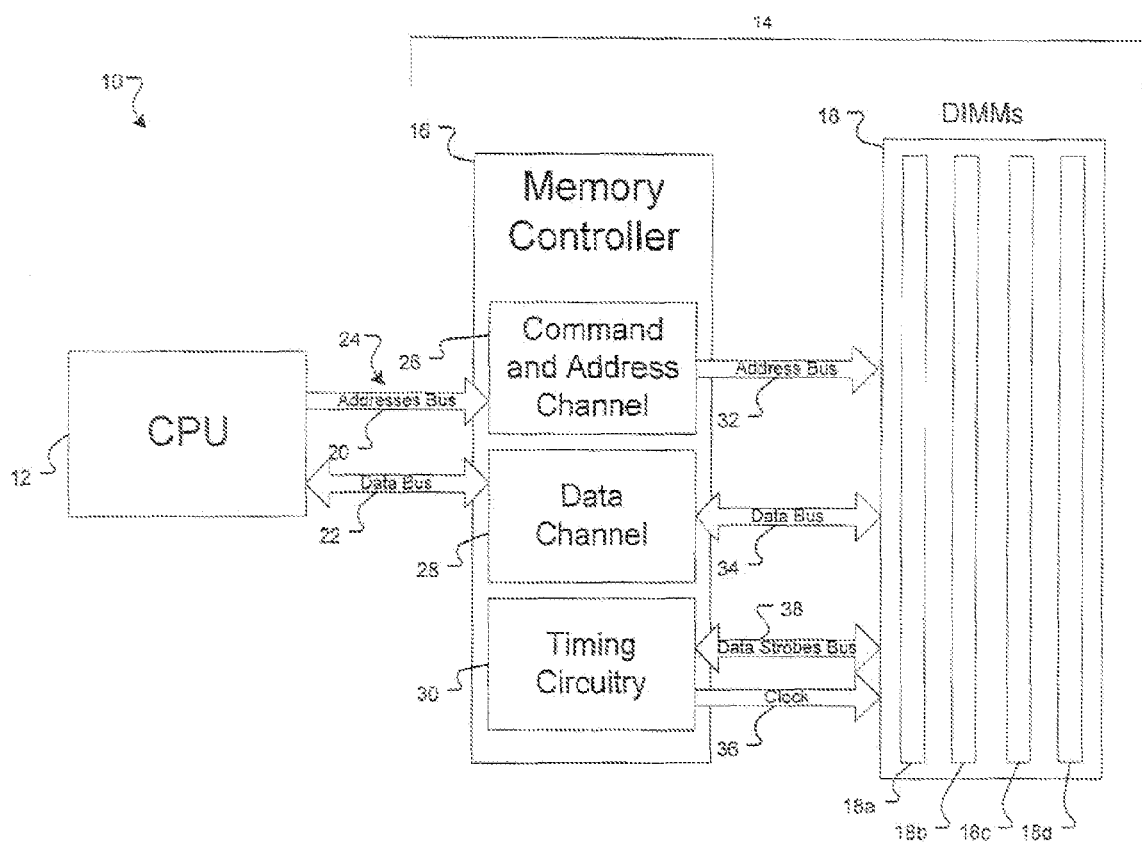
FIG. 1 is a block diagram of an exemplary computer system in accordance with some embodiments.

FIG. 1 is a block diagram depiction of an exemplary computer system 10 in accordance with some embodiments. Computer system 10 includes a processor 12 and a memory subsystem 14. Processor 12 may encompass any one of a variety of commercial available or custom designed processors or central processing units. For example, processor 12 may be a general purpose computer processor, such as the PENTIUM™, CELERON™, or CENTRINO™ processors produced by Intel Corporation or the OPTERON™, TURION™, or ATHLON™ processors produced by Advanced Micro Devices. Processor 12 may also be a special purpose processor, such as a processor designed for use in a wireless telephone, a personal digital assistant, or other computerized device.

Memory subsystem 14 includes memory controller 16 and one or more memory modules 18a, 18b, 18c, and 18d, which are referred to collectively as memory modules 18. Although FIG. 1 illustrates four memory modules 18, this particular depiction is for the sake of illustration only, and in alternate configurations, any suitable number of memory modules 18 may be included in memory subsystem 14.

Processor 12 communicates with memory subsystem 14 over a front side address bus 20 and a front side data bus 22, which are referred to collectively as the "front side bus 24." Processor 12 sends memory addresses and data to memory subsystem 14 and receives data from memory subsystem 14 over front side bus 24.

Memory controller 16 includes command and address channel 26, data channel 28, and a timing circuit 30. Command and address channel 26 relays address information, status information, non-data strobes, and other command information (collectively referred to as "CA information") to memory modules 18. This CA information may be generated by processor 12 or memory controller 16. The command information may include write enable ("WE") signals, row access strobe ("RAS") signals, and column access strobe ("CAS") signals for memory modules 18. Command and address channel 26 is coupled to memory modules 18 via an address bus 32.

Data channel 28 relays computer data itself, such as programs or data, between processor 12 and memory modules 18. This data may include instructions for processor 12, data to be used by processor 12, of other suitable types of info. Data channel 28 is coupled to memory modules 18 via bidirectional data bus 34. In some configurations, memory controller 16 may have multiple data channels 28, each of which is coupled to a group of memory modules 18.

Timing circuitry 30 produces and sends timing information to memory modules 18. This timing information enables memory controller 16 and memory modules 18 to synchronize and coordinate the reading of memory modules 18 ("READ operations") and the writing to memory modules 18 ("WRITE operations"). The timing signals generated by timing circuitry 30 may include a clock signal 36 and one or more data strobes, which are transmitted over a data strobe bus 38. Those of ordinary skill in the art will appreciate, however, that timing signals, such as the data strobes are neither data, nor CA information, but rather provide a timing framework through which memory controller 16 and memory modules 18 can efficiently relay data and CA information between one another.

One type of data strobe is the DQS data strobe ("DQS"). The DQS facilitates multiple memory transactions per clock cycle. For example, in dual data rate ("DDR") memory, data is transmitted between memory controller 16 and memory modules 18 on both the rising and falling edge of clock 36 which allows data to be transmitted at twice the clock speed 36. Memory controller 16 and memory module 18 communicate DQS signals over DQS lines in data strobe bus 38 to coordinate when data should be read off the bidirectional data bus 34. In the illustrated embodiment, the DQS lines carry a DQS signal and an inverted DQS signal. Together these two DQS signals are referred to as a differential DQS signal.

Figure 2:
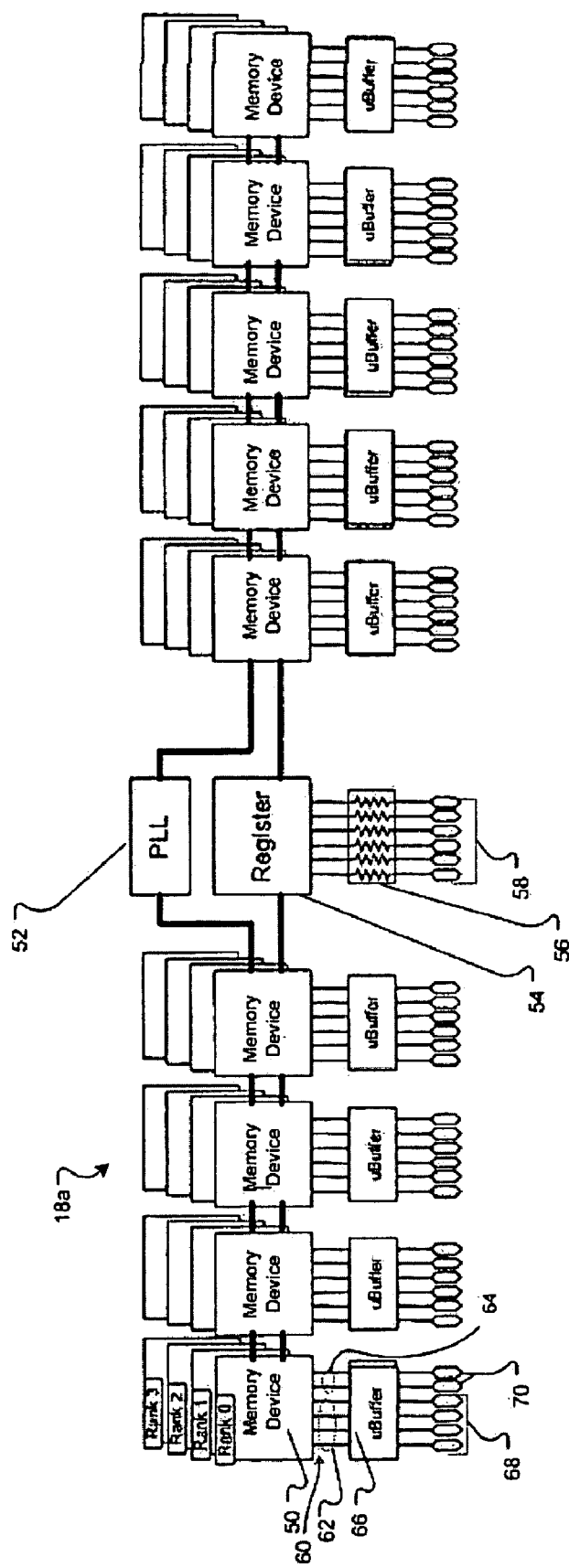
FIG. 2 is a block diagram of an exemplary memory module in accordance with some embodiments.

FIG. 2 shows a depiction of an exemplary embodiment of one of the memory modules 18, memory module 18a, in particular. Memory module 18a includes a plurality of memory devices 50, such as dynamic random access memory devices ("DRAMs"). For example, memory devices 50 may be DDR2 or DDR3 memory devices. In the illustrated embodiment, memory modules 18 comprise dual inline memory modules ("DIMMs"), but in other configurations, different suitable types of memory modules may be employed. For instance, other types of memory, such as static random access memory devices may be employed as memory devices 50.

In the illustrated configuration, memory devices 50 are arranged in four ranks labeled "Rank 0," "Rank 1," "Rank 2," and "Rank 3." A rank is a set of memory devices 50 with common addresses and control whose total number of data lines equals the data width of a memory module 18. Memory devices 50 are connected to data bus 34 as a rank, and memory devices 50 within a rank also share address bus 32. For this reason, if a particular memory address within one of the memory devices 50 in rank is accessed, the same memory address within the other memory devices 50 in that rank will also be accessed. One or more ranks may be placed on a memory module, such as the four ranks on memory module 18a.

Each memory device 50 is coupled to a phase locked loop ("PLL") 52 that receives clock signal 36 and distributes it to memory devices 50. PLL 52 is also referred to as a timing buffer. In other embodiments, such a DDR2 SODIMM configuration, PLL 52 may be omitted. Each memory device 50 may also be coupled to register 54, which serves as a repeater for CA information from address bus 32. More information on suitable designs for register 54 may be found in the PC 1600/2100 DDR SDRAM Registered DIMM, Design Specification, revision 1.2, which is incorporated by reference. Register 54 may be coupled to address bus 32 via a bank of resistors 56 and a plurality of module pins 58. Resistors 56 help to isolate register 54 from address bus 32, which is a multi-drop bus, with the goal of improving the signal integrity on address bus 32. It will be appreciated, however, that in some configurations resistors 56 may be omitted. Additionally, register 54 itself may be omitted, and address bus 32 may be coupled directly to memory devices 50.

Memory devices 50 have a plurality of input/output ("I/O") pins 60, ball grid array ("BGA") balls, or other connections (collectively referred to as "pins"). By way of example, memory devices may have 68 pins 60. I/O pins 60 enable memory device 50 to send and receive data, AC information, clock signals, and data strobes (amongst other things). Two types of I/O pins are illustrated in FIG. 2: data pins 62 and a DQS pins 64. In one configuration, memory device 50 has eight data pins 62 and two DQS pins 64. As those of ordinary skill in the art will appreciate, data pins 62 are bi-directional and, as such, are used for both WRITE operations as well as READ operations.

Data pins 62 and DQS pins 64 are coupled to a microbuffer 66 (alternately referred to and illustrated in FIG. 2 as "uBuffer"). As will be described in further detail below with regard to FIGS. 3-7, microbuffer 66 (and the other microbuffers in FIG. 2) provide direction control at data pins 62 that generally mirrors the directionality of data being transmitted between memory controller 16 and memory device 50. However, microbuffer 66 also may advantageously isolate memory module 50 from data bus 34. This isolation reduces loading of data bus 34 and, thus, may reduce signal integrity problems. This decrease in signal integrity problems may enable a larger number of faster memory modules 50 to be employed on data bus 34. However, because microbuffer 66 does not change the signals passing through it, memory module 18 can be employed in conventional multi-drop memory systems.

Data pins 62 are coupled to data bus 34 via microbuffer 66 and module data pins 68. DQS pins 64 are coupled to data strobes bus 38 via microbuffer 66 and module DQS pins 70. In one embodiment, module pins 68 and 70 are conductive contacts on a DIMM or other type of memory module 18.

Figure 3:
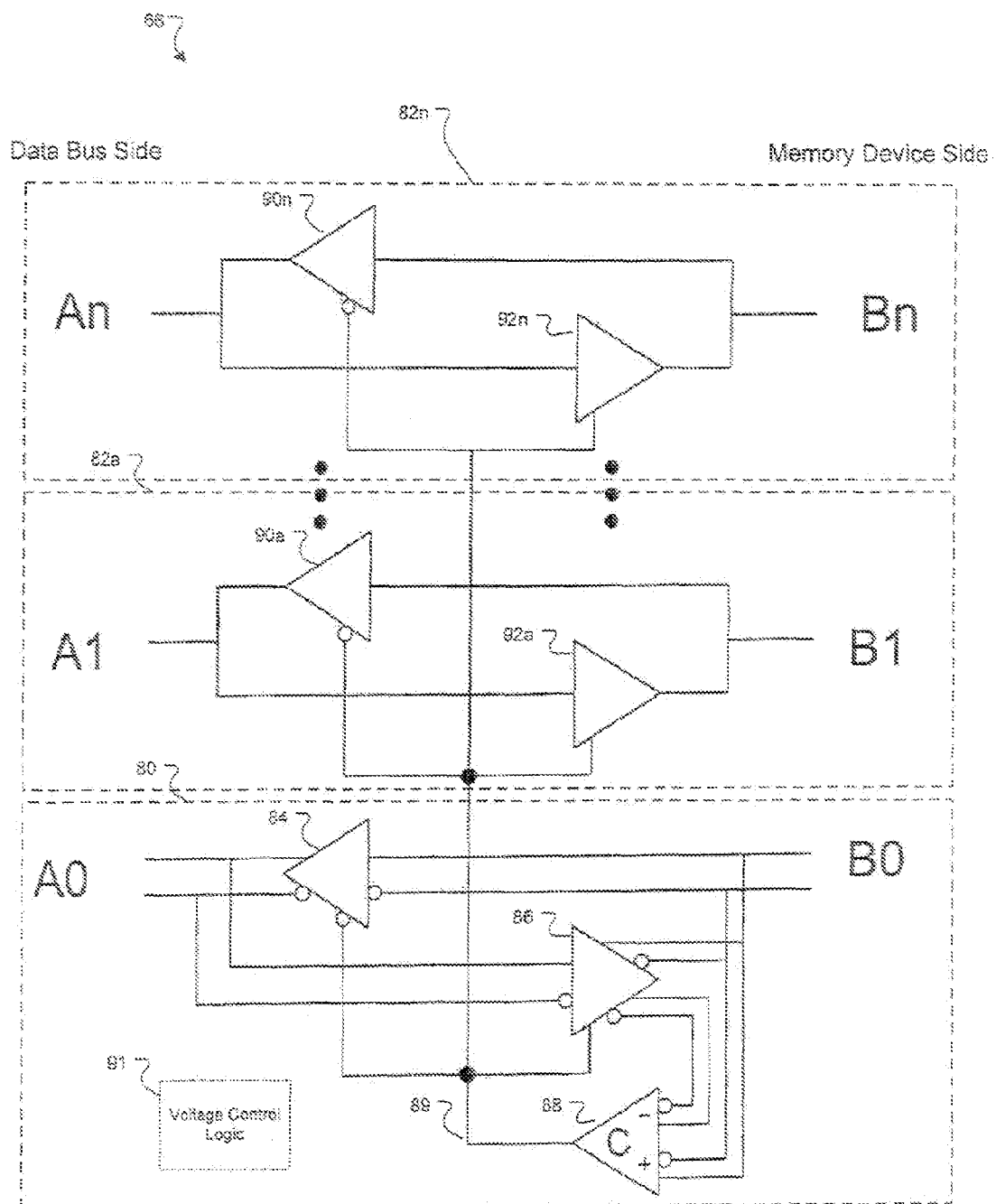
FIG. 3 is a diagram of an exemplary microbuffer in accordance with some embodiments.

FIG. 3 is a diagram depiction of exemplar microbuffer 66 in accordance with some embodiments. Microbuffer 66 has I/O connections on its memory controller side and on its memory device side. The I/O connections on the memory controller side, which are referred to as the "A side connections," are labeled in FIG. 3 as A0, A1, ... An, and the I/O connections on the memory device side, which are referred to as the "B side connections," are labeled as B0, B1, ... Bn. A side connection A0 is coupled to module DQS pins 70 and A side connections A1 ... An are coupled to module data pins 68. Similarly, B side connection B0 is coupled to DQS pins 64 and B side connections B1 ... Bn are coupled to data pins 62.

Microbuffer 66 is logically sub-divided into a DQS module 80 and a plurality of data modules 82a ... 82n (collectively referred to as "data modules 82"). DQS module 80 and data modules 82 are coupled together, as shown in FIG. 3. DQS module 80 includes an A side driver 84 and a B side driver 86 that are coupled to the DQS lines of data strobe 38. In some configurations, drivers 84 and 86 comprise dual output differential drivers. In this illustrated configuration, drivers 84 and 86 are dual output different drivers coupled to DQS pins 64 and module DQS pins 70. DQS Module 80 also includes a comparator 88. Each of the data modules 82 include an A side driver 90a ... 90n and a B side driver 92a ... 92n. As will be described further below, comparator 88 controls whether drivers 90 and 92 are on or off by providing a driver control signal 89 to them.

A side drivers 90 drive data to the A side (data bus 34) and the B side drivers 92 drive data to the B side (memory device 50). In operation, the default state of microbuffer 66 is a "WRITE mode" with A side drivers 90 off and B side drivers 92 driving (i.e., on). This mode is known as the WRITE mode, because when B side drivers 92 are driving, microbuffer 66 (and hence memory module 18) is listening to data bus 34 (i.e., performing or ready to perform WRITE operations or memory module 18). If a WRITE does occur while microbuffer 66 is in the WRITE mode, B side drivers 92 will drive the data to be written onto memory device 50.

However, to perform a READ operation, A side drivers 90 need to be on and B side drivers 92 need to be off. To enter this microbuffer mode, which is referred to the "READ mode," the drivers 90 and 92 switch direction from the WRITE mode.

In one embodiment, this direction switch takes place in less than one clock cycle. Comparator 88 triggers this switch when comparator 88 determines that the next memory transaction will be a READ operation. In one embodiment, comparator 88 triggers the switch by inverting driver control signal 89.

Figure 4:
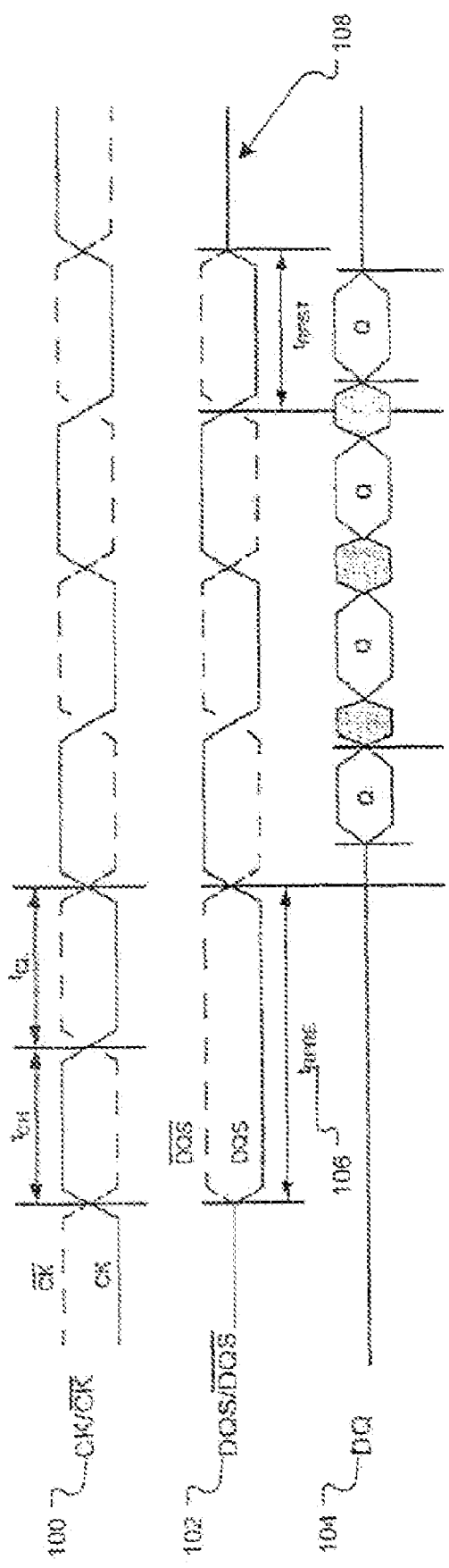
FIG. 4 is a state diagram of an exemplary READ operation in accordance with some embodiments.

Comparator 88 is able to determine that the next memory transaction will be a READ operation by recognizing a READ-specific DQS state on the DQS line. This READ-specific DQS state is illustrated by the exemplary READ operation timing diagram illustrated in FIG. 4. In particular, FIG. 4 shows waveforms for an exemplary clock signal 100, exemplary DQS signals 102, and one exemplary data signal ("DQ") 104. As illustrated, at the beginning of READ operation, memory device 50 drives DQS signal 102 to a low DQS state for a full clock cycle before any data is transmitted (see data signal 104). This low DQS state period is referred to as read preamble ("$t_{RPRE}$") 106.

Comparator 88 can recognize the start of a READ operation by detecting when memory device 50 drives a zero state onto the DQS line. However, because the DQS line is bi-directional and used by both memory device 50 and memory controller 16, comparator 88 is configured to be able to distinguish between a low DQS state driven by memory device 50 and those driven by memory controller 16 through driver 86. In one embodiment, comparator 88 distinguishes between the two low DQS states by comparing their voltage levels. In this embodiment, the voltage of a DQS low state driven by drivers 84 and 86 is set at an alternate or different level from the voltage level of the DQS low state driven by memory device 50. The alternate DQS low state voltage level of drivers 84 and 86 is selected or set such that comparator 88 is able to distinguish between this voltage and a DQS low state generated by memory device 50. At the same time the alternate voltage is sufficiently close to the voltage level of the DQS low state generated by memory device 50 and/or memory controller 16 such that memory device 50 and memory controller 16 can still use the DQS without any modifications to either memory device 50 or memory controller 16. In other words, in this configuration, memory module 18 may advantageously employ conventional memory devices and be used with a conventional memory controller.

By setting comparator 88 to recognize this difference, comparator 88 can distinguish READ operations and WRITE operations, and when appropriate detect the beginning of a READ operation. In one configuration, comparator 88 detects the onset of a READ operation by detecting the particular voltage level of the DQS low state driven by memory device 50. Once the READ is detected, comparator 88 directs drivers 90 and 92 to switch driving directions and carry data from memory device 50 to memory controller 16. Further, as read preamble 106 is an entire clock cycle long, there is typically sufficient time for drivers 90 and 92 to make this directional change between READ data is passed into microbuffer 66.

In one configuration, the low DQS state voltage level of drivers 84 and 86 is fixed at a particular alternate voltage level. In other configurations, the alternate voltage level is configurable or adjustable, either manually or automatically. For example, control logic 91 in microbuffer 66 may be configured to execute a training sequence to identify an alternate low DQS state voltage level that is different from the memory device's low DQS state voltage yet still close enough to the memory device's low DQS state voltage to act as a DQS data state. This training sequence may be stored in software, hardware, firmware, or a combination of one or more of these.

In still other configurations, the DQS low state voltage level of memory device 50 is set at a voltage level that differs from the DQS low state voltage of memory controller 16 and/or drivers 84 and 86. In this configuration (as in other discussed above) comparator 88 detects a READ transaction by detecting the differing voltage level of the memory device's DQS low state. In this case, however it is the memory device's voltage level that is adjusted from the standard DQS low state voltage level instead of the drivers 84 or 86.

Figure 5:
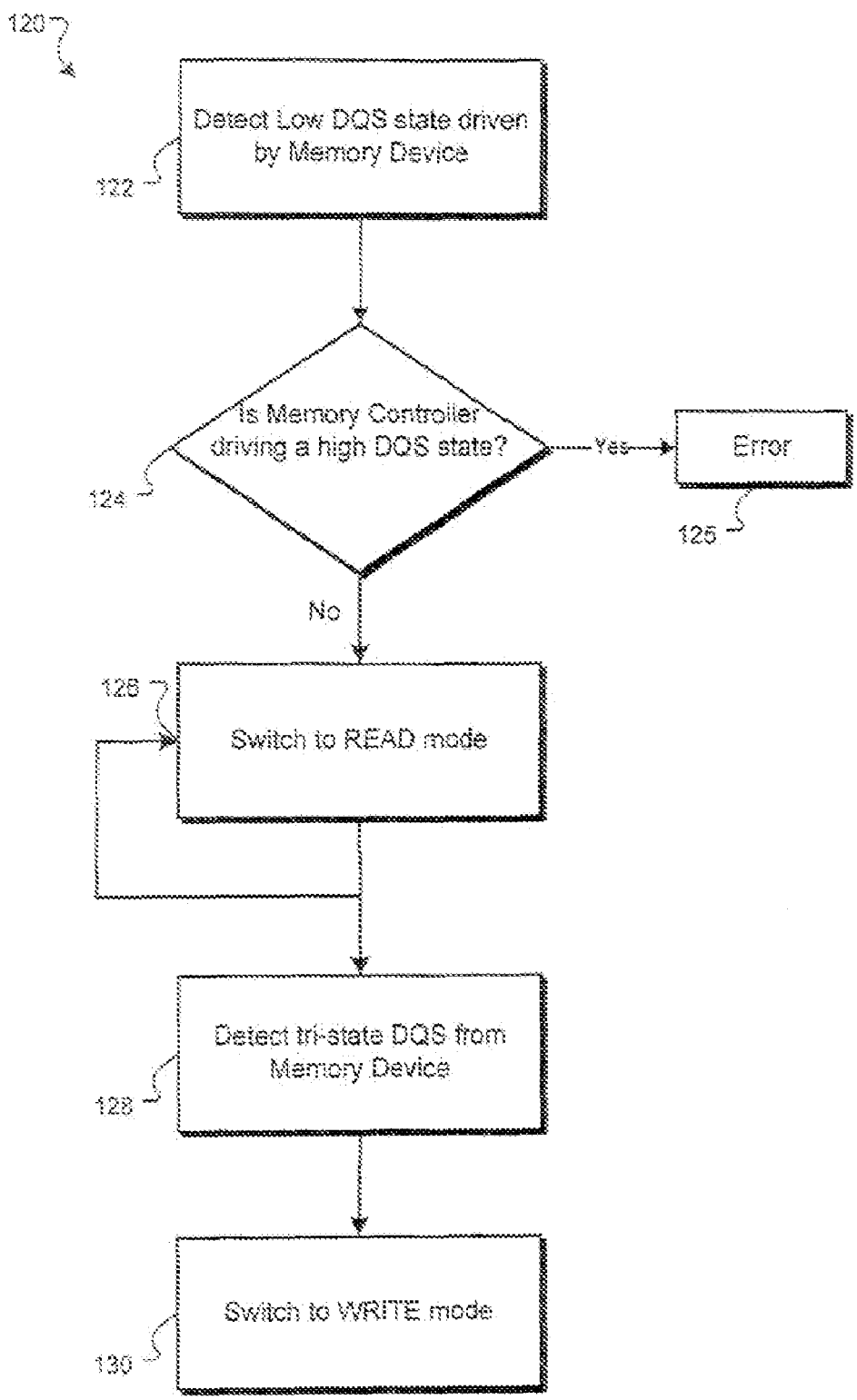
FIG. 5 is a flowchart illustrating an exemplary technique for controlling a microbuffer in accordance with some embodiments.

FIG. 5 illustrates one exemplary technique 120 that comparator 88 or another suitable component may use to control the driving direction of drivers 90 and 92 within microbuffer 66. As indicated by block 122, technique 120 may begin with comparator 88 detecting a low DQS state being driven by memory device 50, as indicated by block 122 and as described above. Technique 120 may next include determining if memory controller 16 is driving a high DQS state, as indicated by block 124. If memory controller 16 is driving a high DQS state, comparator 88 will generate an error, as indicated by block 125, because memory controller is still in the midst of a WRITE operation, and the bidirectional data bus 34 can only support data transmission in one direction at a time.

If memory controller is not driving a high DQS state (i.e., it is either low or tri-stated), comparator 88 will change its output to switch the driving direction of the drivers 90 and 92 and place microbuffer 66 in READ mode, as indicated by block 126. In one embodiment, comparator 88 detects that memory device 50 is driving a low DQS state by sensing a difference between the voltage level that the driver 86 is driving from memory controller 16 and the voltage level that the memory device 50 is driving to driver 84. As described above, the low voltage level of drivers 84 and 86 is set to be different from the low DQS state voltage of memory device 50. During WRITE operations, these two voltage levels will be the same, because memory device 50 is not driving onto the DQS line, which allows driver 86's DQS signals to set the voltage level. However, when memory device 50 begins to drive a low DQS state onto the DQS line, the voltage difference between that voltage and the low DQS state of drivers 84 or 86 (or a tri-state condition on the DQS line) is detected by comparator 88.

In response, to detecting the low DQS state from memory device 50, comparator 88 will cause drivers 92 to tri-state their outputs. Changing these outputs to tri-state helps to ensure that there will be a difference between the state driven by the drivers 92 and the state driven by drivers 90 when memory device 50 is driving data through modules 82a . . . 82n. The comparator 88 will leave drivers 90 and 92 in the "READ mode," as long as there memory device 50 is performing READs.

When memory device 50 is done performing READ operations, it will tri-state its outputs. Comparator 88 will detect that memory device 50 is no longer driving a signal onto the DQS line, as indicated by block 128. Comparator 88 will then cause drivers 90 and 92 to switch directions back to the WRITE mode, as indicated by block 130. A truth table suitable for use by comparator 88 is provided below as Table 1.

TABLE 1

| A side DQS state (Memory Controller) | B side DQS state (Memory Device) | Microbuffer Mode |
| --- | --- | --- |
| High | Tri-State | WRITE |
|  | High | NONE |
|  | Low | NONE |
| Low | Tri-State | WRITE |
|  | High | NONE |
|  | Low | READ |

TABLE 1-continued

| A side DQS state (Memory Controller) | B side DQS state (Memory Device) | Microbuffer Mode |
|---|---|---|
| Tri-State | Tri-State | WRITE |
|  | High | READ |
|  | Low | READ |

As indicated by Table 1, when memory controller 16 is driving a high DQS state, comparator 88 will place microbuffer 66 in WRITE mode by directing drivers 92 to drive and drivers 90 to turn off. Microbuffer 66 is also put in WRITE mode if memory controller 16 is driving a low DQS state and the memory device's DQS is tri-stated or when both devices are tri-stated (as the WRITE mode is the microbuffer's default mode).

Figure 6:
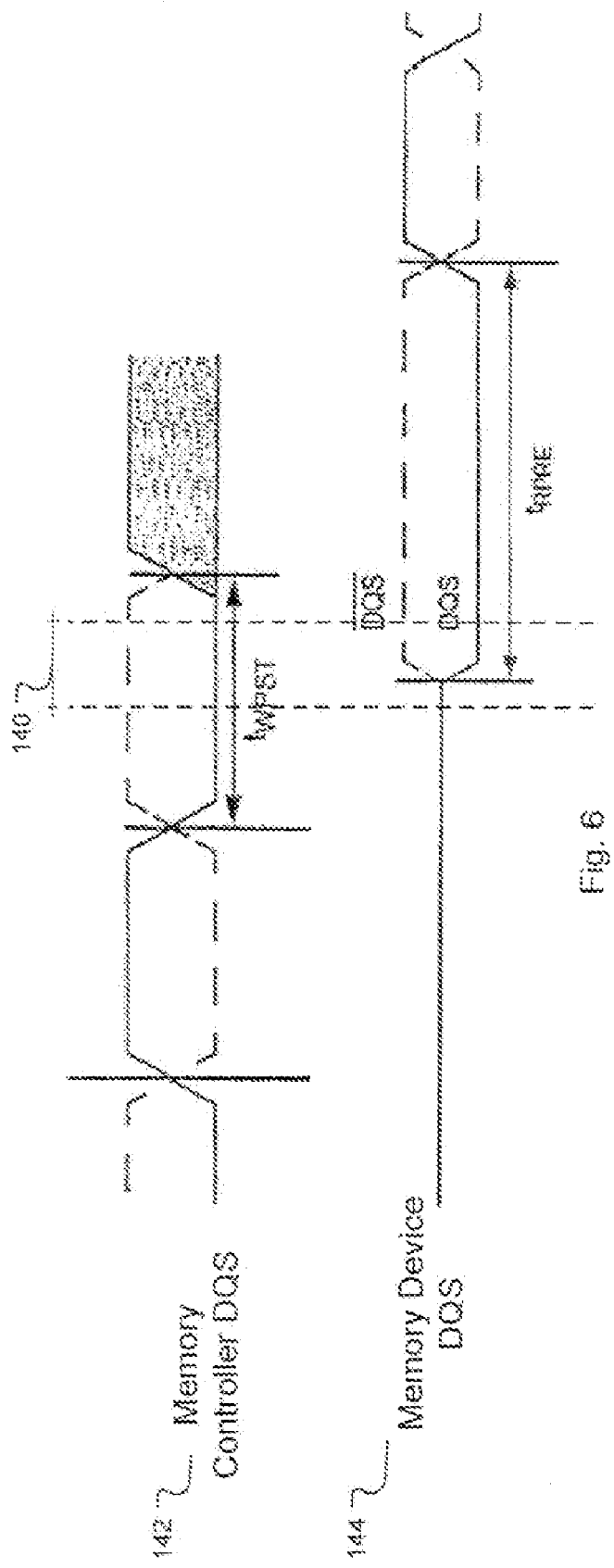
FIG. 6 is a state diagram of overlapping WRITE and READ operations in accordance with some embodiments.

Conversely, comparator 88 will place microbuffer 66 in the READ mode, when memory device drives a low DQS state while memory controller 16 is tri-stated or in a low state. The latter of these—both devices driving a low DQS occurs—may occur briefly when the preamble to a READ instruction (the $t_{RPRE}$ discussed above) overlaps with the end (referred to as the postamble or "$t_{WPST}$") of a WRITE instruction. Exemplary timing diagrams for this condition are illustrated in FIG. 6. As shown, during a period of overlap 140, a low DQS state in the postamble of a WRITE instruction 142 is driven onto the DQS line at the same time as the preamble of a READ operation. Comparator 88 is able to recognize this condition, due to the above-described differences in the low DQS state voltages. As this condition should only occur at the conclusion of a WRITE operation when there is no more data to write, comparator 88 reacts to this condition by placing microbuffer 66 in READ mode in preparation for the forthcoming READ operation.

As indicated by Table 1, comparator 88 is also configured to put microbuffer 66 in READ mode when memory controller 16 is tri-stated and memory device 50 is driving a high DQS state. However, as this high DQS state should only properly occur sometime within a READ operation, there is no active step for comparator 88 to take in response to this condition except not to reenter the WRITE mode. Notably, there is no mode listed for times when memory controller 16 is driving a high DQS state and memory device 50 is driving either a high DQS state or a low DQS state. This is the case, because these conditions are errors that should not occur in a properly functioning memory device.

Figure 7:
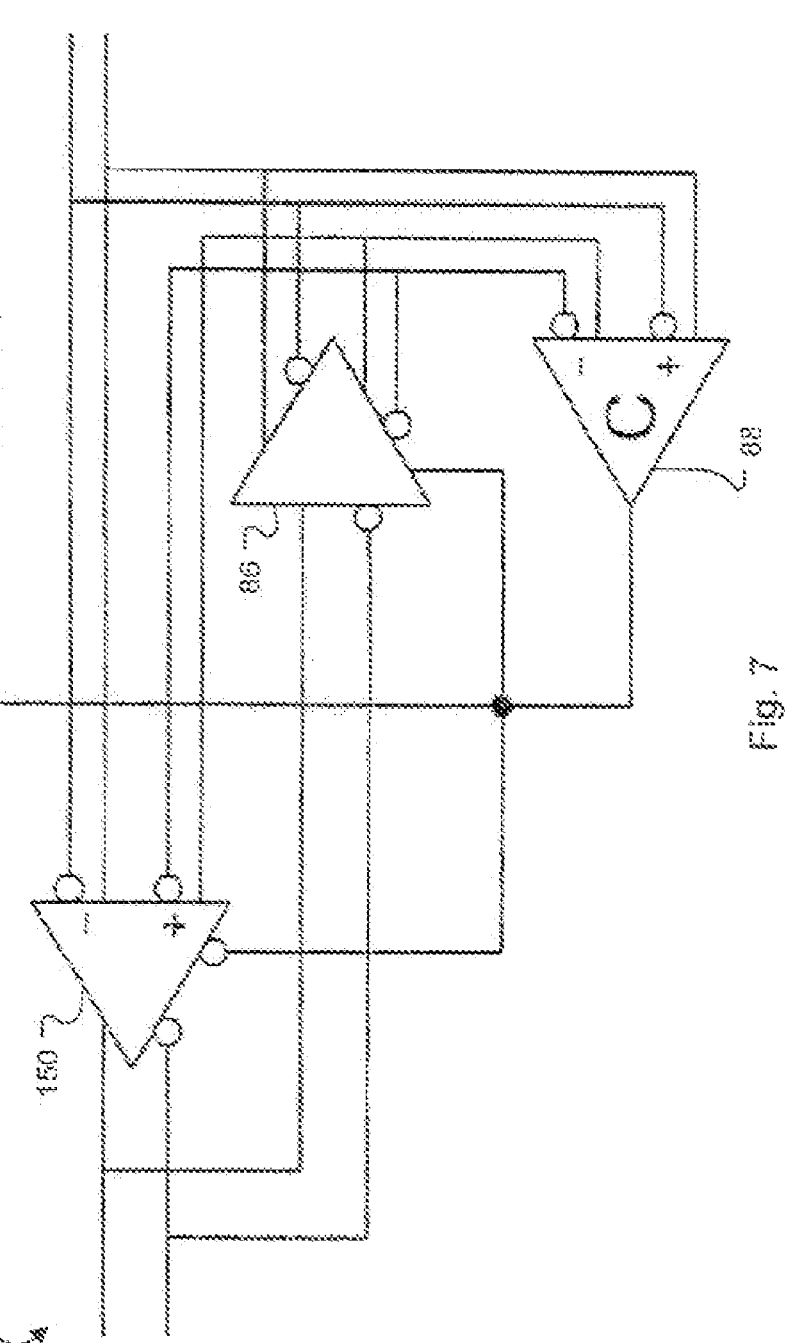
FIG. 7 is a diagram of an alternate embodiment of a DQS module of a microbuffer in accordance with some embodiments.

In some configurations, however, it may take longer to turn off drivers 92 than would be optimal for the DQS lines to be received correctly at memory controller 16, which is the only destination for READ data. In these configurations, driver 84 in module 80 may be replaced by differential amplifier 150, as indicated in FIG. 7. Differential amplifier 150 is configured to subtract any contribution from drivers 92 until comparator 88 is able to change the direction of microbuffer 66 (while driver 86 is turning off).

In particular, when the state of the memory channel side of the microbuffer 66 is in a tri-state (no drivers) or transitioning to a tri-state while the direction is changing, driver 86 will be driving this transitional state onto memory module 18. While the driver 86 is driving this transitional state onto memory module 18, the memory channel side driver is trying to drive that and the memory device signal onto the memory channel. The memory module side driver 86 drives identical copies of the signal onto memory device 50 and to differential amplifier 150. One output drives its received signal onto memory device 50 and the other is feed back to differential amplifier 150. Differential amplifier 150 then subtracts the contribution to the signal on memory device 50 from the signal that a driver within differential amplifier 150 drives onto the memory channel. This results in the signal that memory device 50 drives onto data bus 34 being separated from the multiple drivers on the network and then driven onto the memory channel.

It will be seen by those skilled in the art that many embodiments taking a variety of specific forms and reflecting changes, substitutions, and alternations can be made without departing from the spirit and scope of the invention. Therefore, the described embodiments illustrate but do not restrict the scope of the claims.

What is claimed is:

1. A memory module comprising:
a DRAM device configured to generate a low DQS state on a DQS line; and
a buffer coupled to the DRAM device, the buffer having a plurality of drivers, wherein the buffer is configured to detect the low DQS state by comparing the low DQS state to a low voltage level of one of the plurality of drivers, wherein the low voltage level is adjustable, and wherein the buffer is configured to execute a training routine to adjust the low voltage level.

2. The memory module of claim 1, wherein the buffer comprises a comparator configured to compare the low DQS state to the low voltage level.

3. The memory module of claim 1, wherein the buffer is configured to enter a READ mode in response to detecting the low DQS state.

4. The memory module of claim 3, wherein the buffer is configured to stay in the READ mode until the DRAM device tri-states its connection to the DQS line.

5. The memory module of claim 1, comprising a register coupled to the DRAM device, the register configured to buffer command and address information for the DRAM device.

6. A memory module comprising:
a memory device; and
a buffer communicatively coupled between the memory device and a memory controller, the buffer configured to switch between a WRITE mode and a READ mode based on a state of a data strobe, wherein the buffer comprises:
a data module coupled to a data pin of the memory device; and
a DQS module configured to control a data transmission direction of the data module, wherein the data module comprises:
a first driver configured to drive signals onto the memory device; and
a second driver configured to drive signals to the memory controller; and
wherein the DQS module comprises a comparator with an output that is coupled to control inputs of the first and second differential drivers.

7. The memory module of claim 6, wherein the buffer comprises a comparator configured to determine the state of the data strobe.

8. The memory module of claim 6, wherein the comparator is coupled to a DQS line and configured to generate the output based on a state of the DQS line.

9. The memory module of claim 8, wherein the comparator is configured to turn on the second driver if the comparator determines that the memory device is driving a low DQS state onto the DQS line.

10. The memory device of claim 9, wherein the comparator is configured to turn off the first differential driver if the comparator determines that the memory device is driving a low DQS state onto the DQS line.

11. The memory module of claim 6, wherein the comparator is configured to differentiate between a low DQS state driven by the memory device and a low DQS state driven by a third driver in the DQS module.

12. The memory module of claim 11, wherein the memory device is configured to drive a DQS low state at a first voltage level, wherein the first voltage level is not equal to a second voltage level of the low DQS state driven by the third driver.

13. The memory module of claim 12, comprising logic configured to control the second voltage level.

14. The memory module of claim 13, wherein the logic is configured to set a voltage level that is recognized by the memory device as a low DQS state.

15. The memory module of claim 6, wherein the DQS module comprises:
 a first dual output differential driver configured to drive DQS signals onto the memory device; and
 a second dual output differential driver configured to drive DQS signals to the memory controller, wherein the first and second dual output differential drivers are coupled to the comparator.

16. A method comprising:
 detecting a low DQS state being driven on a DQS line by a memory device; and
 switching to a READ mode in response to the detection, wherein switching to the READ mode comprises turning off a first differential driver and turning on a second differential driver.

17. The method of claim 16, comprising:
 detecting a tri-state from the memory device on the DQS line; and
 switching from the READ mode a WRITE mode in response to the tri-state detecting.

18. A memory system comprising:
 a memory controller; and
 a memory module comprising:
   a plurality of memory devices; and
   a buffer coupled between the plurality of memory devices and the memory controller, the buffer configured to switch between a WRITE mode and a READ mode based on a state of a DQS line between the memory controller and the memory module, wherein the memory devices are configured to generate a DQS low state having a voltage level unequal to a low voltage level of a driver coupled to the DQS line, wherein the driver is within the buffer.

* * * * *

UNITED STATES PATENT AND TRADEMARK OFFICE
CERTIFICATE OF CORRECTION

PATENT NO. : 7,508,723 B2  Page 1 of 1
APPLICATION NO. : 11/753460
DATED : March 24, 2009
INVENTOR(S) : Paul Goodwin It is certified that error appears in the above-identified patent and that said Letters Patent is hereby corrected as shown below:

In Claim 17, Column 10, Line 11, delete "mode a" and insert -- mode to a --, therefor.

Signed and Sealed this

Eighteenth Day of August, 2009

David J. Kappos
*Director of the United States Patent and Trademark Office*